United States Patent [19]
Brekelmans

[11] Patent Number: 6,125,269
[45] Date of Patent: Sep. 26, 2000

[54] TV FM RECEIVER FOR MULTIMEDIA APPLICATIONS

[75] Inventor: Johannes H. A. Brekelmans, Singapore, Singapore

[73] Assignee: U.S. Philips Corporation, New York, N.Y.

[21] Appl. No.: 08/779,411

[22] Filed: Jan. 7, 1997

[30] Foreign Application Priority Data

Jan. 10, 1996 [SG] Singapore ............................. 9600123

[51] Int. Cl.[7] ........................................ H04B 1/18
[52] U.S. Cl. ................................. 455/180.1; 455/191.2; 455/193.2; 455/302; 334/1; 334/15; 334/47; 348/552; 348/729
[58] Field of Search ........................... 455/180.1, 179.1, 455/183.2, 184.1, 187.1, 188.1, 188.2, 189.1, 190.1, 191.1, 191.3, 193.1, 193.2, 197.3, 552, 557, 558, 272, 275, 279.1, 339, 340, 266, 191.2; 348/554, 555, 558, 552, 729, 460

[56] References Cited

U.S. PATENT DOCUMENTS

| | | | |
|---|---|---|---|
| 3,903,487 | 9/1975 | Maier | 455/191.2 |
| 3,980,957 | 9/1976 | Putzer | 334/15 |
| 4,905,306 | 2/1990 | Anderson | 455/191.3 |
| 5,148,280 | 9/1992 | Wignot et al. | |
| 5,148,420 | 9/1992 | Yamamuro | |
| 5,532,760 | 7/1996 | Inoue | 348/729 |

FOREIGN PATENT DOCUMENTS

| | | |
|---|---|---|
| 0318118A2 | 5/1989 | European Pat. Off. |
| 5-64101 | 3/1993 | Japan |
| 9221195A1 | 11/1992 | WIPO |

*Primary Examiner*—Lee Nguyen
*Attorney, Agent, or Firm*—Edward W. Goodman

[57] ABSTRACT

A receiver for receiving both first-type reception signals, for example TV signals, and second-type reception signals, for example, FM-radio signals. The receiver may be used in multimedia applications. In the receiver, a reception signal is fed via an input section RFI-L, RFA-L, BPF-L to a mixer MIX-L. To obtain a relatively good performance, a band-pass filter BPF-L in the input section can be tuned through a frequency band, in which reception signals of both the first and the second type are present. The filter characteristics of the band-pass filter BPF-L are switched in accordance with the type of reception signal desired. For example, switching provides a passband which is substantially narrower for FM reception than for TV reception.

4 Claims, 4 Drawing Sheets

TV FM RECEIVER FOR MULTIMEDIA APPLICATIONS

FIELD OF THE INVENTION

1. Background of the Invention

The invention relates to a receiver for receiving reception signals of a first type, for example, TV signals, and of reception signals of a second type, for example, FM-radio signals. The invention also relates to a multimedia apparatus incorporating such a receiver. The receiver may enhance the functionality of the multimedia apparatus for, for example, TV and FM-radio reception. The multimedia apparatus may be a personal computer (PC) having slots into which add-on cards are plugged. The receiver may be implemented on one of these add-on cards. Accordingly, the PC can access information transmitted by FM-radio and TV stations.

2. Description of the Related Art

A receiver capable of receiving TV and FM-radio signals is described in U.S. Pat. No. 5,148,280. In the prior-art receiver, TV and FM-radio signals are applied to a single tuner via an FM trap filter. The FM trap filter attenuates, to some extent, reception signals within the FM-radio band from 88 MHz to 108 MHz. U.S. Pat. No. 5,148,280 claims that favorable results are obtained in this manner.

In the single tuner, a mixer converts a particular reception signal into a fixed intermediate frequency (IF) of approximately 40 MHz, which is common for TV reception. The IF signal produced by the tuner is processed differently for TV or FM-radio reception. For TV reception, the IF signal is processed in a manner which is very similar to IF signal processing in most present-day TV receivers. For FM-radio reception, the IF signal is applied to a single chip FM-radio integrated circuit (IC) via a filter unit. In the FM-radio IC, the IF signal is frequency-converted to obtain a nominal 10.7 MHz FM IF signal which is further processed in a common manner.

Although U.S. Pat. No. 5,148,280 deals with the issues of sensitivity and overload, the prior-art receiver performs inadequately in many applications. In particular, the prior-art receiver has a rather poor FM-radio reception.

SUMMARY OF THE INVENTION

It is an object of the invention to provide a receiver which has a better performance than the above-described prior-art receiver.

One aspect of the invention provides a receiver for receiving reception signals of a first type and reception signals of a second type, the receiver comprising an input section for providing, in response to a reception signal, a mixer input signal; a mixer for providing, in response to the mixer input signal, an intermediate frequency signal; a first intermediate frequency signal processing arrangement coupled to process said intermediate frequency signal when receiving said first type reception signals; and a second intermediate frequency signal processing arrangement coupled to process said intermediate frequency signal when receiving said second type reception signals, characterized in that said input section comprises a band-pass filter which is tunable in a frequency band in which both first and second type reception signals are present, and which band-pass filter is switchable so as to filter said first type reception signals and said second type reception signals differently.

According to another aspect of the invention, a multimedia apparatus comprises such a receiver.

Yet another aspect of the invention provides a tuner for receiving reception signals of a first type and reception signals of a second type, the tuner comprising an input section for providing, in response to a reception signal, a mixer input signal; and a mixer for providing, in response to the mixer input signal, an intermediate frequency signal; characterized in that said input section comprises a band-pass filter, which is tunable in a frequency band in which both first and second type reception signals are present, and which band-pass filter is switchable so as to filter said first type reception signals and said second type reception signals differently.

The invention may be used for the reception of both TV and FM-radio signals. In an example of such a use, a switchable band-pass filter filters both TV and FM-radio signals for supply to a common mixer. The switchable band-pass filter is tuned to the desired reception signal. For TV reception, the band-pass filter has filter characteristics which are similar to those in most present-day TV-receiver mixer input filters. For FM-reception, the band-pass filter is switched to provide a passband which is substantially narrower than in TV reception.

The invention takes the following into consideration. A switchable band-pass filter can be implemented at low cost and, furthermore, it can be implemented in such a way that it has a relatively small size. Referring to the above example, a tuner which comprises both the switchable band-pass filter and the mixer, can be implemented in such a way that its cost and size is comparable with that of a conventional TV tuner.

The above example may be compared with the prior-art receiver. In the above example, the switchable band-pass filter prevents overload of the mixer by attenuating undesired FM-radio signals which may have a relatively large amplitude. An FM-trap, as in the prior-art receiver, is not required for this purpose. The FM-trap in the prior-art receiver degrades the sensitivity in FM-reception by attenuating not only undesired FM-radio signals, but also the desired FM-radio signal. Due to the fact that the switchable band-pass filter in the above example provides selectivity in the FM-radio band, a substantially better sensitivity can be obtained as compared with the prior-art receiver. In addition, the selectivity makes it also possible to meet certain official requirements, such as the CENELEC EN55020 standard.

Furthermore, both the cost and size of the above example may in fact, be smaller than the cost and size of the prior-art receiver. First, the switchable band-pass filter itself can be smaller and cheaper than the FM-trap. Secondly, the switchable band-pass filter relaxes any requirements imposed on other filters which follow the mixer, such that these filters may be small and cheap. In this respect, reference is made to the filter unit coupled between the tuner and the FM-radio IC, which filter unit has to meet relatively strict requirements and which is, therefore, relatively costly and spacious. If a switchable band-pass filter had been used in the tuner of the prior-art receiver, the requirements imposed on the filter unit would have been more relaxed and, consequently, the filter unit could be smaller and cheaper.

The invention is particularly suitable for multi-media applications. Many multi-media applications use add-on cards of a standard size. As indicated in the opening paragraph, a receiver in accordance with the invention may be implemented on a standard-size add-on card. The relatively small size of the receiver leaves room for other circuitry on the standard-size add-on card, which may further enhance the functionality of this card. It should also be noted that a part of the receiver is preferably housed in a shielded metal box, to counter interference produced by digital signals in a multi-media apparatus. The smaller the receiver, the less space the shielded metal box will take up, which makes the receiver suitable for a great variety of multimedia applications.

The invention will hereinafter be described in greater detail with reference to examples shown in the drawings. Furthermore, advantageous implementation details, will also be described with reference to the examples shown.

DESCRIPTION OF THE PREFERRED EMBODIMENTS

The invention will be described, by way of example, with reference to the FIG. 1 tuner which can receive both TV and FM-radio signals. In this respect, implementation aspects of the FIG. 1 tuner will also be discussed with reference to FIGS. 2 to 4, and an example of a multi-media application of the FIG. 1 tuner will be discussed with reference to FIG. 5. Finally, some remarks will be made so as to indicate that the scope of the invention is well beyond the examples shown in the Figures.

Figure 1:
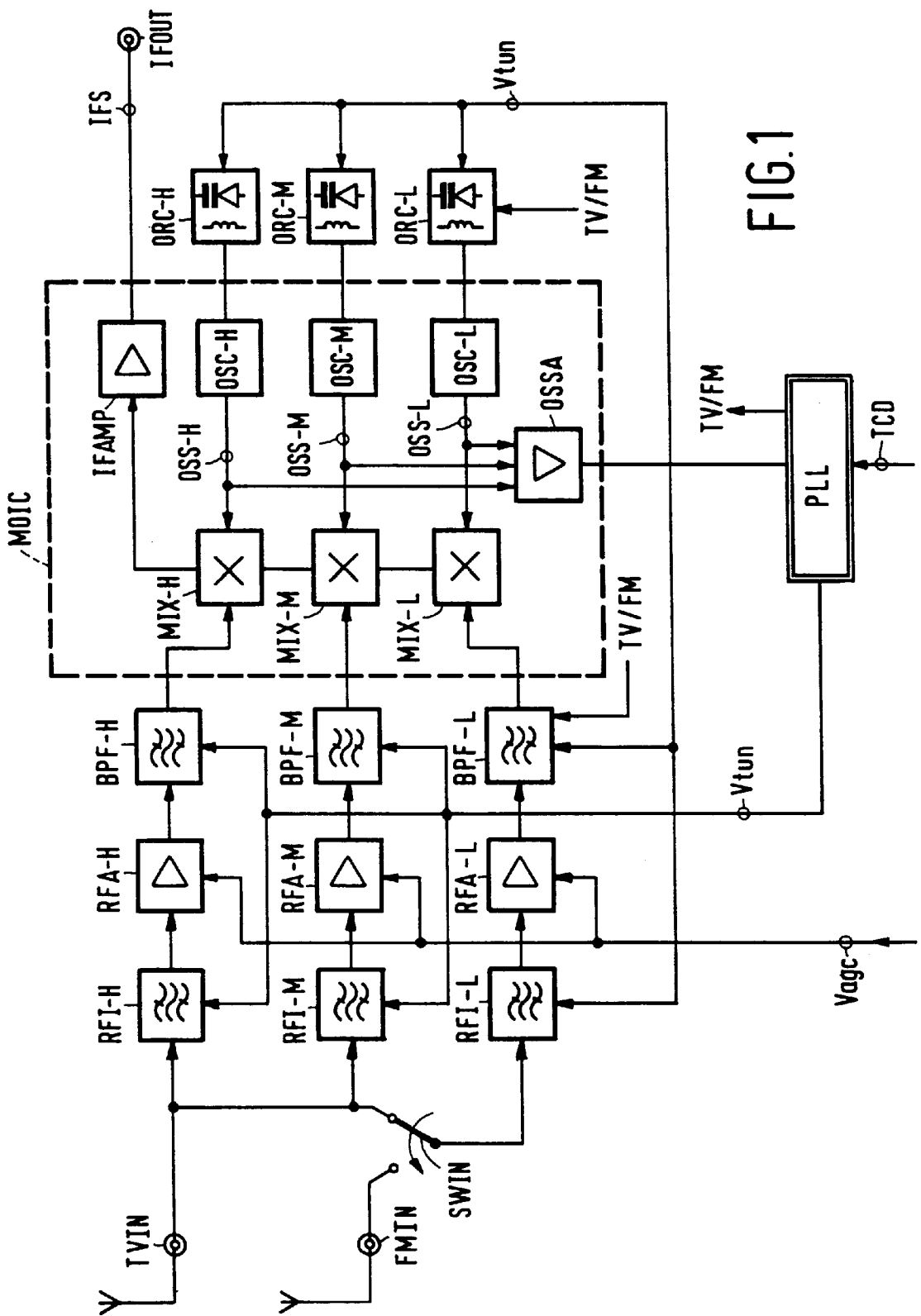
FIG. 1 shows an example of a tuner in accordance with the invention, in the form of a block diagram.

Referring to the FIG. 1 tuner, TV and FM-radio signals may be applied to inputs TVIN and FMIN, respectively. The FIG. 1 tuner receives tuning control data TCD relating to a desired reception signal, for example, the frequency and the type of signal: TV or FM. In response to the desired reception signal, the FIG. 1 tuner provides an intermediate frequency signal IFS at an output IFOUT.

The FIG. 1 tuner may operate in two modes: a TV-mode, if the desired reception signal is a TV signal, or an FM-mode, if the desired reception signal is an FM-radio signal. In the TV-mode, the intermediate frequency signal IFS is at an intermediate frequency of 38.9 MHz, hereinafter abbreviated to TV-IF. In the FM-mode, the intermediate frequency signal IFS is at an intermediate frequency of 10.7 MHz, hereinafter abbreviated to FM-IF.

The FIG. 1 tuner is based on a three-band concept. This means that the FIG. 1 tuner comprises three separate branches for processing the TV signals in three respective frequency bands: the high-band, the medium-band and the low-band. Each branch comprises the following parts: an input filter RFI-H/-M/-L, an input amplifier RFA-H/-M/-L, a band-pass filter BPF-H/-M/-L, a mixer MIX-H/-M/-L, an oscillator circuit OSC-H/-M/-L and an oscillator resonant circuit ORC-H/-M/-L. The suffixes -H, -M and -L used in the reference signs for these parts indicate whether a relevant part belongs to the high-, medium- or low-band branch. The FIG. 1 tuner may be implemented by using a mixer-oscillator integrated circuit MOIC, for example, of the type TDA 5736 manufactured by Philips Semiconductors, which comprises the parts within the broken-line rectangle designated MOIC in FIG. 1.

In the FIG. 1 tuner, FM-radio signals are processed in the low-band branch. A switch SWIN couples the low-band branch either to the input TVIN or to the input FMIN. In the first-mentioned case, TV signals are supplied to the low-band branch, in the last-mentioned case, FM-radio signals are supplied to the low-band branch.

In each branch, the input filter RFI-H/-M/-L attenuates signals which are relatively distant in frequency from the desired reception signal, to prevent overload of the input amplifier RFA-H/-M/-L. The amplifier RFA-H/-M/-L is controlled by a gain control voltage Vagc. The band-pass filter BPF-H/-M/-L provides a further attenuation of undesired signals. The mixer MIX-H/-M/-L effects a frequency shift of the desired reception signal by multiplying the desired reception signal with an oscillator signal OSS-H/-M/-L. The oscillator signal OSS-H/-M/-L is generated by the oscillator circuit OSC-H/-M/-L and the oscillator resonant circuit ORC-H/-M/-L, which determines the frequency of the oscillator signal OSS-H/-M/-L. The mixer provides, via an intermediate frequency amplifier IFAMP, the intermediate frequency signal IFS.

In each branch, a phase-locked loop circuit PLL controls the oscillator signal OSS-H/-M/-L of the relevant branch. The phase-locked loop circuit PLL derives, in a conventional manner, a tuning voltage Vtun from the tuner control data TCD and the oscillator signal OSS-H/-M/-L received via an oscillator signal amplifier OSSA. The tuning voltage Vtun is applied to the oscillator resonant circuit ORC-H/-M/-L. In the TV-mode, the oscillator signal OSS-L in the low-band branch, is set to a frequency which is the sum of the desired reception signal and the TV-IF (38.9 MHz). In the FM-mode, the oscillator signal OSS-L is set to a frequency which is the sum of the desired reception signal and the FM-IF (10.7 MHz).

In each branch, the tuning voltage Vtun is also used to vary the respective passbands of the input filter RFI-H/-M/-L and the band-pass filter. The passbands should preferably encompass the desired reception signal. If not, the desired reception signal is distorted and undesired signals may not be sufficiently attenuated. In the TV-mode, the passbands should encompass the difference of the oscillator signal frequency and the TV-IF. In the FM-mode, the passbands should be centered at the difference of the oscillator signal frequency and the FM-IF. The position of the passbands with respect to the frequency of the oscillation signal, while tuning through the reception bands, is hereinafter referred to as tracking.

The phase-locked loop circuit PLL also provides a mode switch signal TV/FM. In the low-band branch, the mode switch signal TV/FM is used to switch the oscillator resonant circuit ORC-L. The oscillator signal OSS-L is switched to a higher frequency in the TV mode than in the FM-mode, for a given value of the tuning voltage Vtun. Respective passbands of the input filter RFI-L and the band-pass filter BPF-L remain substantially constant for a given value of the tuning voltage Vtun. Thus, the frequency offset between the input filter RFI-L and the band-pass filter BPF-L, on the one hand, and the oscillator signal OSS-L, on the other hand, is switched. The frequency offset is preferably switched to TV-IF in the TV-mode, and to FM-IF in the FM-mode.

In addition, the mode control signal TV/FM preferably switches the pass-bandwidth of the band-pass filter BPF-L in the low-band branch. In the TV-mode, the band-pass filter BPF-L preferably has a relatively wide passband, for example, 10 MHz, whereas in the FM-mode the passband is preferably relatively narrow, for example, 1 MHz.

Figure 2:
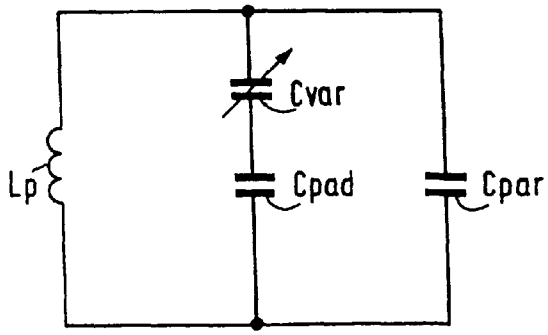
FIG. 2 is a simplified equivalent circuit diagram of resonant circuits for the FIG. 1 tuner.

FIG. 2 shows a basic resonant circuit for implementations of the input filter RFI-L, the band-pass filter BPF-L and the oscillator resonant circuit ORC-L in the low-band branch of the FIG. 1 tuner. The FIG. 2 basic resonant circuit comprises an inductance Lp, a controllable capacitance Cvar, a padder capacitance Cpad and a parallel capacitance Cpar. The value of the controllable capacitance depends on the tuning voltage Vtun. The controllable capacitance may be a varicap diode to which the tuning voltage Vtun is applied in a conventional manner.

In an implementation of the FIG. 1 tuner, identical varicap diodes are used in the input filter RFI-L, the band-pass filter BPF-L and the oscillator resonant circuit ORC-L in the low-band branch. The capacitance of the identical varicap diodes can be varied between 2.5 pF and 61.5 pF as a function of the tuning voltage Vtun. The values of the other elements are preferably chosen to be such that good tracking is obtained, both in the TV-mode and in the FM-mode.

Table 1 shows the preferred values for the other elements in the FIG. 2 basic resonant circuit. The column entitled RF lists the preferred element values for the input filter RFI-L and the band-pass filter BPF-L in the low-band branch. The column entitled RF+38.9 MHz lists the preferred element values for the low-band oscillator resonant circuit ORC-L in the TV-mode. The column RF+10.7 MHz lists the preferred element values for the low-band oscillator resonant circuit ORC-L in the FM-mode. The row entitled F(res) indicates the frequency bands through which the respective basic resonant circuits can be tuned. For example, the band-pass filter BPF-L in the low-band branch is tunable through a frequency-band from 46 to 175 MHz.

TABLE 1

|  | RF | RF + 38.9 MHz | RF + 10.7 MHz |
| --- | --- | --- | --- |
| Lp | 190 nH | 100.3 nH | 159.6 nH |
| Cpad | 4.7 nF | 68 pF | 184 pF |
| Cpar | 1.926 pF | 3.237 pF | 2.22 pF |
| Fres(MHz) | 46 . . . 175 | 84.9 . . . 213.9 | 56.7 . . . 185.7 |

In the oscillator resonant circuit ORC-L, the inductance Lp should have a higher value in the FM-mode than in the TV-mode. The same applies to the padder capacitance Cpad. However, the parallel capacitance Cpar should be lower in the FM-mode than in the TV-mode.

To obtain preferred element values in the oscillator resonant circuit ORC-L in the FM-mode and in the TV-mode, three switches can be used. Referring to FIG. 2, a series arrangement of a switch and a capacitance, not shown, can be coupled parallel to the padder capacitance Cpad. The same can be coupled parallel to the parallel capacitance Cpar. The inductance Lp can be split up into two inductances in series, not shown, and a switch can be coupled parallel to one of these inductances. Referring to FIG. 1, the switches may be controlled by the mode switch signal TV/FM.

Figure 3A:
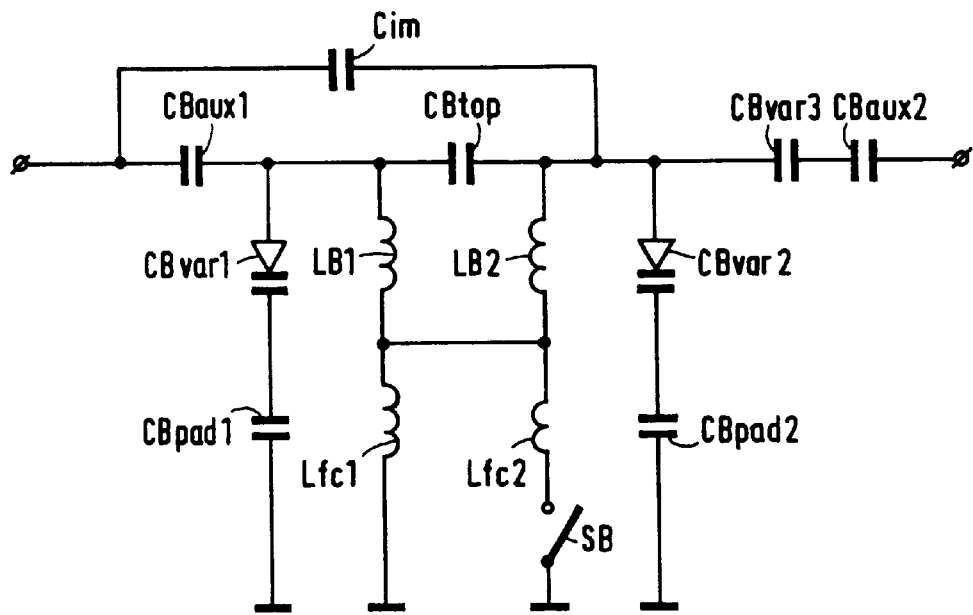
FIG. 3a is an equivalent circuit diagram of switchable band-pass filters for the FIG. 2 tuner.

FIG. 3a is an equivalent circuit diagram of a band-pass filter for use in the low-band branch of the FIG. 1 tuner. In the FIG. 3a circuit diagram, there are two resonant circuits. A first resonant circuit includes an inductance LB1, a controllable capacitance CBvar1 and a capacitance CBpad1. A second resonant circuit includes an inductance LB2, a controllable capacitance CBvar2 and a capacitance CBpad2. The FIG. 3a circuit diagram further includes auxiliary capacitances CBaux1 and CBaux2, an auxiliary variable capacitance CBvar3 and an image suppression capacitance Cim.

The two resonant circuits in FIG. 3a are mutually coupled by means of a top-coupling capacitance CBtop and by means of a primary foot-coupling inductance Lfc1. Furthermore, a series arrangement of a secondary foot-coupling inductance Lfc2 and a switch SB is coupled parallel to the primary foot-coupling inductance Lfc1. Accordingly, a switchable inductive foot-coupling is obtained. When the switch SB is closed, the inductive foot-coupling is weaker than when the switch SB is opened.

Referring to FIGS. 1 and 3a, the mode control signal TV/FM controls the switch SB. In the TV-mode, the switch SB is opened so as to obtain an over-critical coupling between the two resonant circuits in FIG. 3a. In the FM-mode, the switch SB is closed so as to obtain an under-critical coupling between the two resonant circuits in FIG. 3a.

Figure 3B:
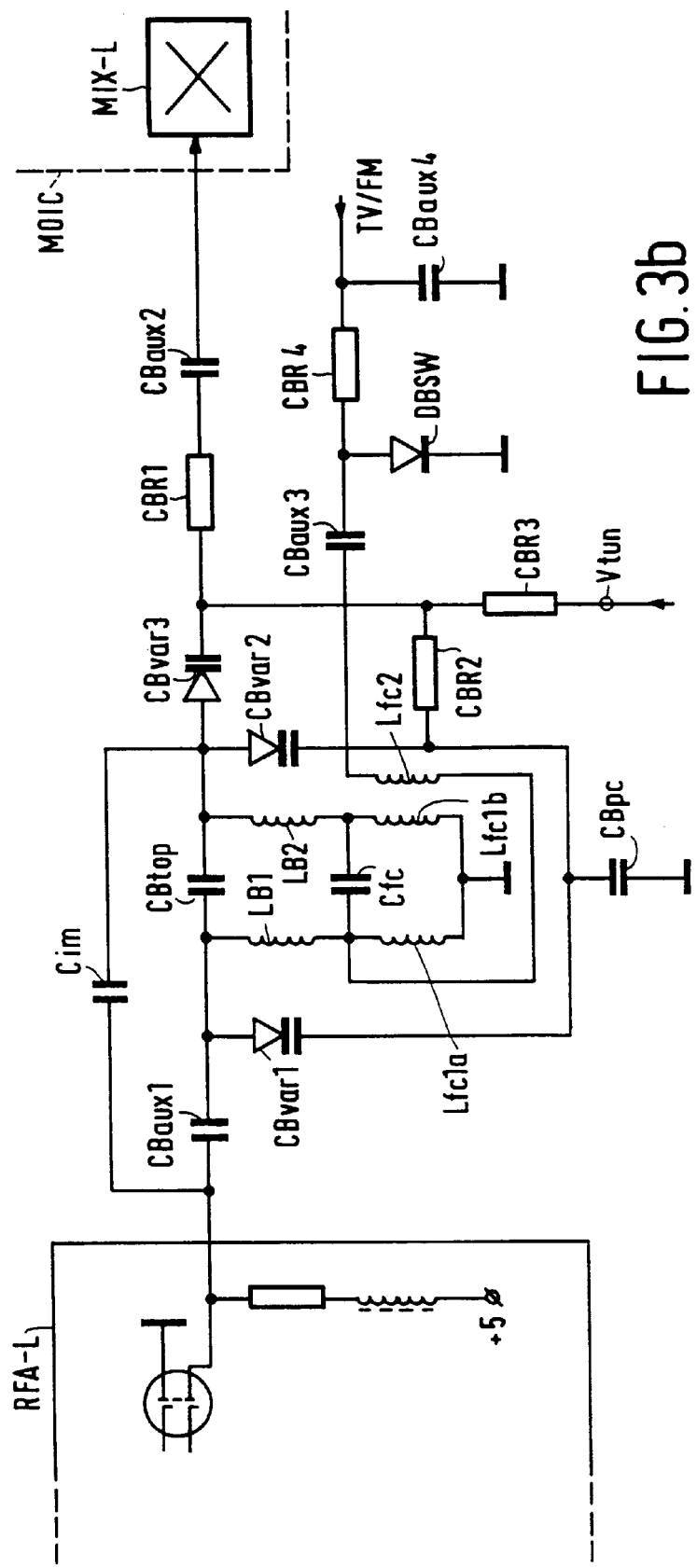
FIG. 3b shows, in a circuit diagram form, an example of a switchable band-pass filter implementation in the FIG. 2 tuner.

FIG. 3b shows an implementation of the band-pass filter BPF-L which is coupled between the input amplifier RFA-L and the mixer MIX-L in the low-band branch of the FIG. 1 tuner. The FIG. 3b implementation has the following particularities as compared with the FIG. 3a circuit. First, in the FIG. 3b implementation, the primary foot-coupling inductance Lfc1 is implemented by means of two foot-coupling inductors Lfc1a and Lfc1b. Each of the two foot-coupling inductors Lfc1a and Lfc1b has one end which is coupled to the inductors LB1 and LB2, respectively, and to the other coupling inductor via a foot-coupling capacitance Cfc. The foot-coupling capacitance Cfc has a relatively low impedance at frequencies within the low-band and may, by approximation, be regarded as a short circuit.

A second particularity of the FIG. 3b implementation, as compared with the FIG. 3a circuit, is that a single capacitor CBpc in FIG. 3b provides the two separately shown capacitances CBpad1 and CBpad2 in FIG. 3a. The reason for using the single capacitor CBpc is component efficiency and the fact that the filter characteristics are hardly affected by this. In an implementation of the FIG. 3b circuit as band-pass filter BPF-L in the FIG. 1 tuner, the preferred values of capacitances Cpad1 and Cpad2 are relatively high. The capacitor CBpc in the FIG. 3b implementation effectively provides the two high-value capacitances Cpad1 and Cpad2, shown in FIG. 3a, which are present between the controllable capacitances CBvar1 and CBvar2, respectively, and signal ground. Due to the fact that the capacitor CBpc in the FIG. 3b implementation has a high value and, consequently, has a relatively low impedance, there is little coupling between the resonant circuits as a result of the capacitor CBpc, which coupling could affect the filter characteristics.

In the FIG. 3b implementation, varicap diodes form the controllable capacitances CB1var1, CBvar2 and CBvar3. The varicap diodes receive the tuning voltage Vtun via at least one of the resistors CBR2 and CBR3. A resistor CBR1 is coupled in series with the auxiliary capacitor CBaux2 to optimize the coupling to the mixer MIX-L.

In the FIG. 3b implementation, a switching diode DBsw effectively constitutes the switch S shown in FIG. 3a. In the TV-mode, the switching diode Dsw is non-conductive so as to obtain an over-critical coupling between the resonant circuits. In the FM-mode, the switching diode Dsw is conductive so as to obtain an under-critical coupling between the resonant circuits. In addition, the following elements are used for switching the coupling between the over-critical and the under-critical state. An auxiliary capacitor CBaux3 couples the switching diode DBsw to the secondary foot-coupling inductance Lfc2. The mode switch signal TV/FM in the FIG. 1 tuner is applied to the switching diode via a resistor CBR4. An auxiliary capacitor CBaux4 suppresses unwanted feed-through of signals from the inductive foot-coupling onto the line conveying the TV/FM mode switch signal.

In the FIG. 3b implementation, the following component values provided a satisfactory performance:

Cim: 0.06 pF

CBaux1: 2 pF

CBtop: 0.1 pF

Cfc: 680 pF

CBpc: 4.7 nF

LB1, LB2: 175 nH

Lfc1a, Lfc1b: 32 nH

Lfc2: 6 nH

Values of components which are not listed above are less critical for the filter characteristics.

Not all the electrical elements shown in FIG. 3b need to be realized with discrete components. In particular, the image capacitance Cim, the top-coupling capacitance CBtop and the secondary foot-coupling inductance LFc2 may be obtained by a suitable lay-out of a printed circuit board (PCB) used to realize the FIG. 3b circuit. For example, a PCB-track may constitute the foot-coupling inductance Lfc2. In addition, a stray inductance of the switching diode DBsw may also effectively contribute to the foot-coupling inductance Lfc2. Capacitive coupling between relevant PCB-tracks may provide the image capacitance Cim and, likewise, the top-coupling capacitance CBtop can be obtained, as well as any other capacitance of relatively small value.

Figure 4:
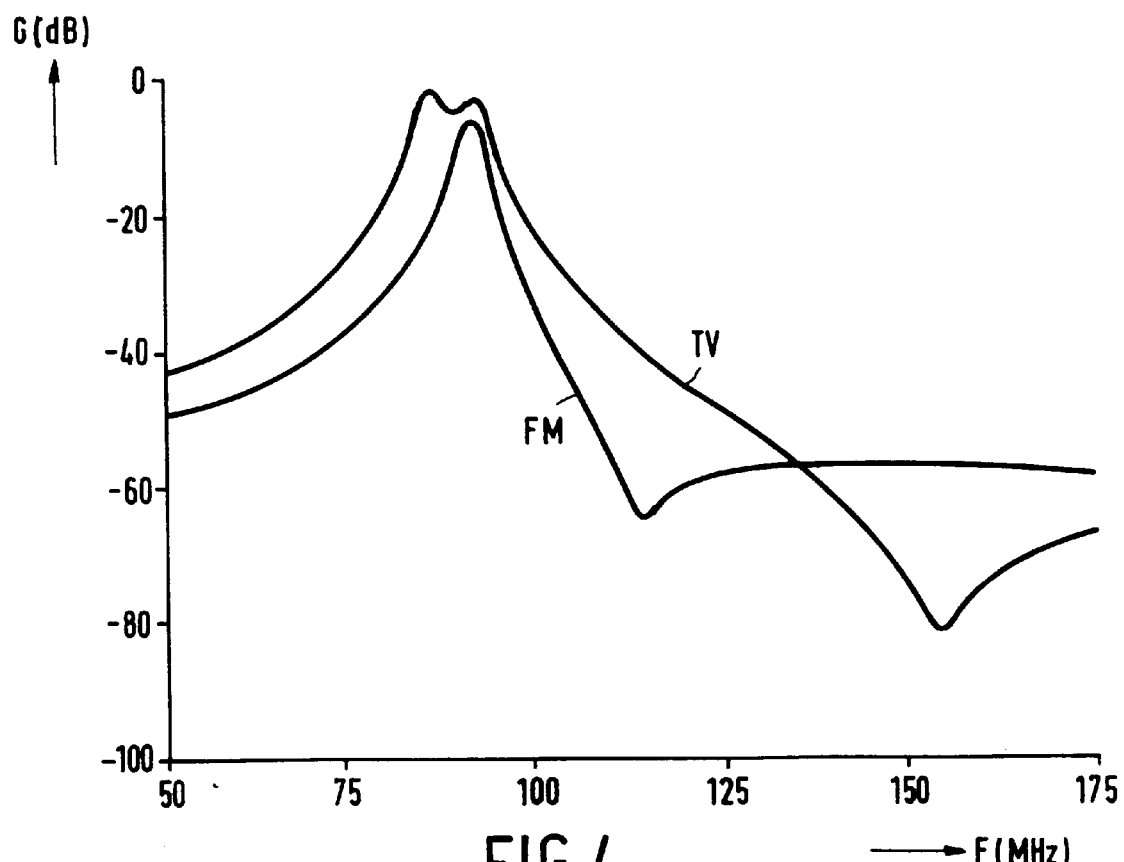
FIG. 4 illustrates the filter characteristic of the FIG. 3b circuit by means of gain versus frequency plots.

FIG. 4 illustrates filter characteristics of the FIG. 3b implementation, with the values listed above and for a certain value of the tuning voltage Vtun. In FIG. 4, the gain G expressed in decibels (dB) is plotted on the vertical axis, and the frequency expressed in MegaHertz (MHz) is plotted on the horizontal axis. FIG. 4 includes two plots of gain versus frequency: one plot is denoted as TV and one is denoted as FM, which illustrate the filter-characteristics in the TV-mode and the FM-mode, respectively.

FIG. 4 clearly shows differences between the filter characteristics, in the TV-mode and in the FM-mode, of the FIG. 3b implementation. First, the passband in the filter characteristic is narrower in the FM-mode than in the TV-mode. In the TV-mode, the 3 dB passband is about 10 MHz wide, which is somewhat wider than the band-width of a TV reception signal. In the FM-mode, the dB passband is reduced to about 2.5 MHz.

Secondly, in the TV-mode the passband has two peaks, whereas in the FM-mode the pass-band is a single peak. The two peaks clearly result from the over-critical coupling, in the TV-mode, between the resonant circuits in the FIG. 3b implementation. The single peak results from the under-critical coupling, in the FM-mode, when the switching diode Dsw is non-conductive.

Thirdly, the center-frequency of the pass-band in the FM-mode is slightly higher than in the TV-mode. In other words, when the state of the switching diode Dsw is changed, a small de-tuning occur. The de-tuning is caused by switching the inductive foot-coupling between the resonant circuits in the FIG. 3b implementation. The switching changes the effective inductance values in the resonant circuits, and thereby the resonance frequencies. Referring to the FIG. 1 tuner, de-tuning of the band-pass filter BPF-L when switching from the TV-mode to the FM-mode, or vice versa, poses no real problem. Any de-tuning can be accounted for in the alignment of the oscillator resonant circuit ORC-L, for example, which alignment is made to obtain a satisfactory tracking. It is also possible to correct the input filter RFI-L in view of any de-tuning in the band-pass filter BPF-L.

Fourthly, the pass-band has a somewhat lower gain in the FM-mode than in the TV-mode. This effect is also related to the coupling between the resonant circuits in the FIG. 3b implementation. With under-critical coupling, there is more signal loss in the FIG. 3b implementation than with over-critical coupling.

Fifth, the filter characteristics include notches which are different in the TV-mode and in the FM-mode. In the TV-mode, a notch is located approximately twice the TV-IF above the pass-band. In the FM-mode, a notch is located approximately twice the FM-IF above the passband. The notches contribute to the image suppression which is required in the reception signal path to the mixer MIX-L. The notches are highly influenced by the image capacitance Cim, which can be explained as follows.

The secondary resonant circuit, which includes inductance LB2, receives a signal via the image capacitance Cim. The secondary resonant circuit also receives a signal via the primary resonant circuit, which includes inductance LB1. At resonance frequency, these signals are in phase and the image capacitor Cim contributes to the capacitive top-coupling, similar to the top-coupling capacitance CBtop. However, at a certain frequency, relatively far above the resonance frequency, the signals will be in anti-phase and may substantially cancel each other. This manifests itself as the notches shown in FIG. 4. By properly choosing components values, it is possible to position the notches in such a way that they substantially contribute to the image suppression, as shown in FIG. 4, both in the TV-mode and in the FM-mode. Thus, when switching from the TV-mode to the FM-mode, or vice versa, the image suppression adjusts itself in accordance with the new IF.

Figure 5:
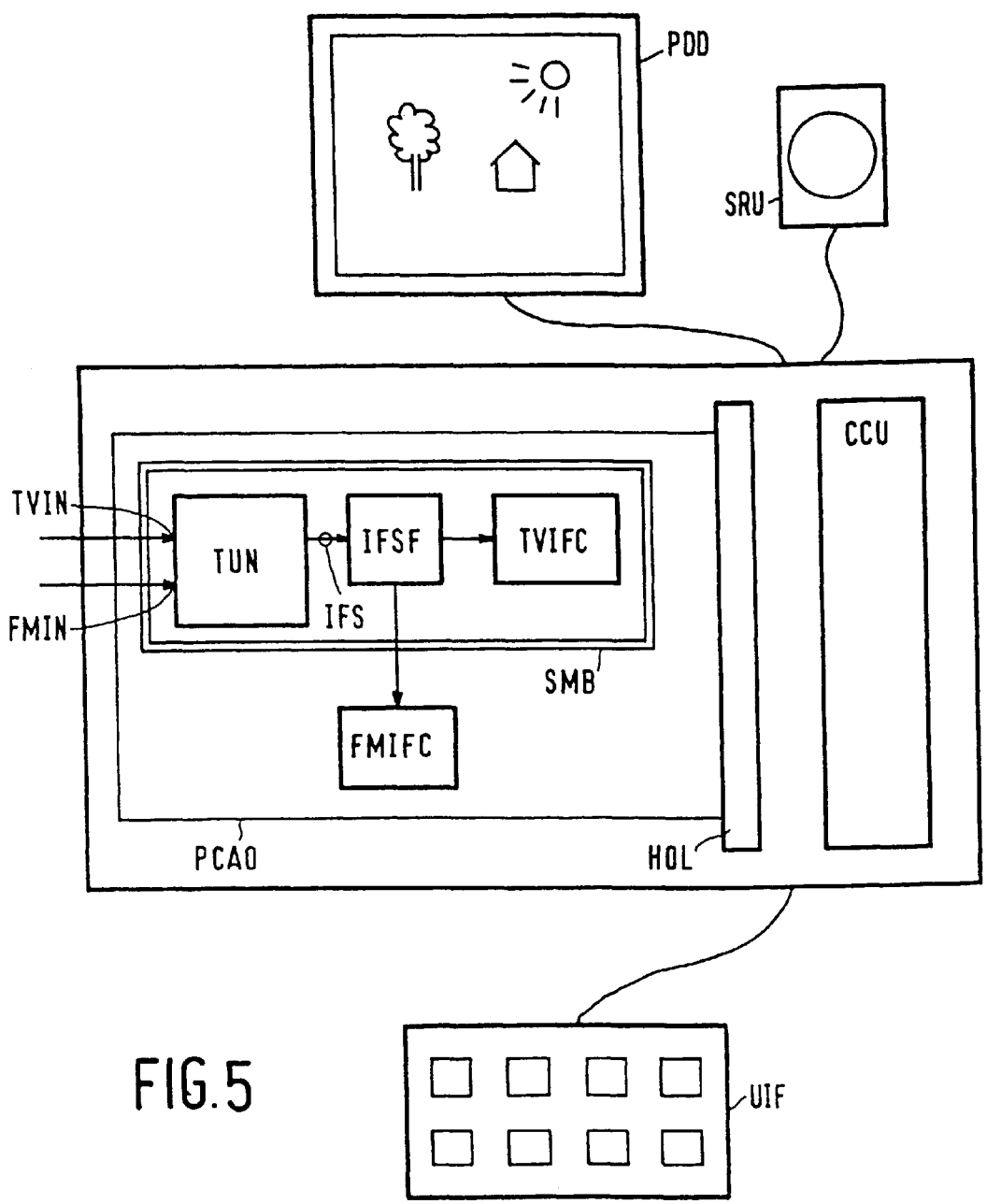
FIG. 5 shows, in an abstract diagram form, an example of a multimedia apparatus comprising the FIG. 2 tuner.

FIG. 5 shows an example of a multimedia apparatus comprising the FIG. 1 tuner TUN. The FIG. 1 tuner TUN is implemented on an add-on card PCAO which is plugged into an add-on card holder HOL of the multi-media apparatus. Apart from the FIG. 1 tuner TUN, the add-on card includes TV IF signal processing circuitry TVIFC and FM IF signal processing circuitry FMIFC. The latter circuitries receive the intermediate frequency signal IFS provided by the FIG. 1 tuner TUN via an IF splitting filter IFSF. The FIG. 1 tuner TUN, the IF splitting filter IFSF and the TV IF signal processing circuitry TVIFC are housed in a shielded metal box SMB. The shielded metal box SMB with the aforementioned parts may, as such, be manufactured and sold to add-on card manufacturers.

The FIG. 5 multi-media apparatus includes a user interface UIF, a control unit CCU, a picture display device PDD, and a sound reproduction unit SRU. A user selects the desired reception signal via the user interface UIF. For example, he may enter a program number on a keyboard which is part of the user-interface UIF. The control unit CCU effectively controls the add-on card PCAO, such that the FIG. 1 tuner TUN selects the desired reception signal. For example, the control unit CCU provides instructions which are stored in a memory, not shown, relating to the frequency of the desired reception signal and the type of signal: FM or TV. These instructions are supplied to the FIG. 1 tuner TUN in the form of the tuner control data TCD. The add-on card PCAO provides sound and/or video information, for example, obtained from the desired reception signal, which information may be further processed in the control unit CCU. The sound and/or video information is provided to the user via the sound reproduction unit SRU and the picture display device PDD, respectively.

Evidently, the invention may be implemented differently from the examples described above. To indicate that the scope of the invention is well beyond the examples described above, some final remarks are made.

It should be noted that the invention is not limited to combined TV and FM-radio reception.

It should also be noted that the invention is not limited to two different types of reception signals. For example, in a receiver for receiving three types of reception signals, a band pass filter may be switchable to provide three, or even more, different filter characteristics.

It should further be noted that the invention is not limited to a 3 band tuner concept, as shown in FIG. 1. In principle, the invention may be applied in any tuner concept, for example, in a 2-band tuner concept.

Finally it should be noted that the invention is not limited to multimedia applications. The invention may be used in any apparatus comprising a receiver, such as TV receivers and video-tape recorders.

What is claimed is:

1. A receiver for receiving reception signals of a first type and reception signals of a second type, the receiver comprising:

an input section for providing, in response to a reception signal, a mixer input signal, said input section comprising a band-pass filter tunable in a frequency band in which reception signals of both said first and second types are present, said band-pass filter comprising a tunable first resonant circuit, a tunable second resonant circuit, and means for switching a coupling between the first and second resonant circuits, whereby said band-pass filter is switchable for filtering said reception signals of the first type and said reception signals of the second type differently;

a mixer for providing, in response to the mixer input signal, an intermediate frequency signal;

a first intermediate frequency signal processing arrangement coupled to said mixer for processing said intermediate frequency signal when said reception signals are of said first type; and a second intermediate frequency signal processing arrangement coupled to said mixer for processing said intermediate frequency signal when said reception signals are of said second type, characterized in that the coupling between the first and second resonant circuits is switchable between an under-critical state and an over-critical state.

2. A receiver as claimed in claim 1, characterized in that said band-pass filter comprises:

an image suppression capacitor via which an input signal is fed to the second resonant circuit.

3. A multi-media apparatus comprising:

a receiver for receiving reception signals of a first type and reception signals of a second type; and a control unit for controlling said receiver and for processing data signals, wherein the receiver comprising:

an input section for providing, in response to a reception signal, a mixer input signal, said input section comprising a band-pass filter tunable in a frequency band in which reception signals of both said first and second types are present, said band-pass filter comprising a tunable first resonant circuit, a tunable second resonant circuit, and means for switching a coupling between the first and second resonant circuits, whereby said band-pass filter is switchable for filtering said reception signals of the first type and said reception signals of the second type differently;

a mixer for providing, in response to the mixer input signal, an intermediate frequency signal;

a first intermediate frequency signal processing arrangement coupled to said mixer for processing said intermediate frequency signal when said reception signals are of said first type; and a second intermediate frequency signal processing arrangement coupled to said mixer for processing said intermediate frequency signal when said reception signals are of said second type, characterized in that the coupling between the first and second resonant circuits is switchable between an under-critical state and an over-critical state.

4. A tuner for receiving reception signals of a first type and reception signals of a second type, the tuner comprising:

an input section for providing, in response to a reception signal, a mixer input signal; and a mixer for providing, in response to the mixer input signal, an intermediate frequency signal, characterized in that said input section comprises a band-pass filter tunable in a frequency band in which reception signals of both said first and second types are present, said band-pass filter comprising a tunable first resonant circuit, a tunable second resonant circuit, and means for switching a coupling between the first and second resonant circuits, whereby said band-pass filter is switchable for filtering said reception signals of the first type and said reception signals of the second type differently, and wherein the coupling between the first and second resonant circuits is switchable between an under-critical state and an over-critical state.

* * * * *